(12) United States Patent
Wasson

(10) Patent No.: US 9,070,514 B2
(45) Date of Patent: Jun. 30, 2015

(54) HIGH DENSITY CAPACITOR ARRAY PATTERNS

(71) Applicant: MEDTRONIC, INC., Minneapolis, MN (US)

(72) Inventor: James R. Wasson, Tempe, AZ (US)

(73) Assignee: Medtronic, Inc., Minneapolis, MN (US)

( * ) Notice: Subject to any disclaimer, the term of this patent is extended or adjusted under 35 U.S.C. 154(b) by 132 days.

(21) Appl. No.: 13/759,109

(22) Filed: Feb. 5, 2013

(65) Prior Publication Data

US 2013/0148260 A1 Jun. 13, 2013

Related U.S. Application Data

(62) Division of application No. 12/750,301, filed on Mar. 30, 2010, now Pat. No. 8,395,880.

(51) Int. Cl.
*H01G 4/002* (2006.01)
*H01G 4/33* (2006.01)
*H01G 4/005* (2006.01)
*H01G 4/012* (2006.01)
*H01L 27/02* (2006.01)
*H01L 49/02* (2006.01)

(52) U.S. Cl.
CPC ............ *H01G 4/33* (2013.01); *Y10T 428/24479* (2015.01); *H01G 4/005* (2013.01); *H01G 4/012* (2013.01); *H01L 27/0207* (2013.01); *H01L 28/91* (2013.01)

(58) Field of Classification Search
USPC ............... 361/301.1, 301.2, 301.4, 311–313, 361/321.1, 306.1, 303–305
See application file for complete search history.

(56) References Cited

U.S. PATENT DOCUMENTS

| | | | |
|---|---|---|---|
| 5,352,622 A * | 10/1994 | Chung | ........................... 438/396 |
| 5,616,511 A | 4/1997 | Hirota | |
| 5,898,982 A | 5/1999 | Metzler et al. | |
| 6,121,653 A | 9/2000 | Juengling | |
| 6,331,461 B1 | 12/2001 | Juengling | |
| 7,009,832 B1 | 3/2006 | Chen et al. | |
| 7,544,563 B2 | 6/2009 | Manning | |
| 7,557,015 B2 | 7/2009 | Sandhu et al. | |
| 8,004,064 B2 | 8/2011 | Shoji | |
| 8,395,880 B2 * | 3/2013 | Wasson | ....................... 361/301.1 |
| 2008/0304209 A1 | 12/2008 | Brabeck et al. | |
| 2009/0244808 A1 | 10/2009 | Ohtsuka et al. | |

OTHER PUBLICATIONS

Yannou, "NXP Vision of System-In-Package: much more than just advanced packaging", Euripides Meeting, Jun. 28, 2007, 27 pages, http://euripides-eureka.eu/docs/11-Yannou.pdf.

(Continued)

*Primary Examiner* — Nguyen T Ha
(74) *Attorney, Agent, or Firm* — Evans M. Mburu

(57) ABSTRACT

A thin-film device system includes a substrate and a plurality of pillars. The plurality of pillars project from a surface of the substrate. Each of the plurality of pillars have a perimeter that includes at least four protrusions that define at least four recessed regions between the at least four protrusions. Each of the at least four recessed regions of each of the plurality of pillars receives one protrusion from an adjacent one of the plurality of pillars. A thin-film device is fabricated over the plurality of pillars.

16 Claims, 13 Drawing Sheets

(56) References Cited

OTHER PUBLICATIONS (PCT/US2011/028667) International Preliminary Report on Patentability, Mailed Oct. 2, 2012, 10 pages.

(PCT/US2011/028667) PCT Notification of Transmittal of the International Search Report and thhe Written Opinion of the International Searching Authority, Mailed Aug. 12, 2011, 15 pages.

* cited by examiner

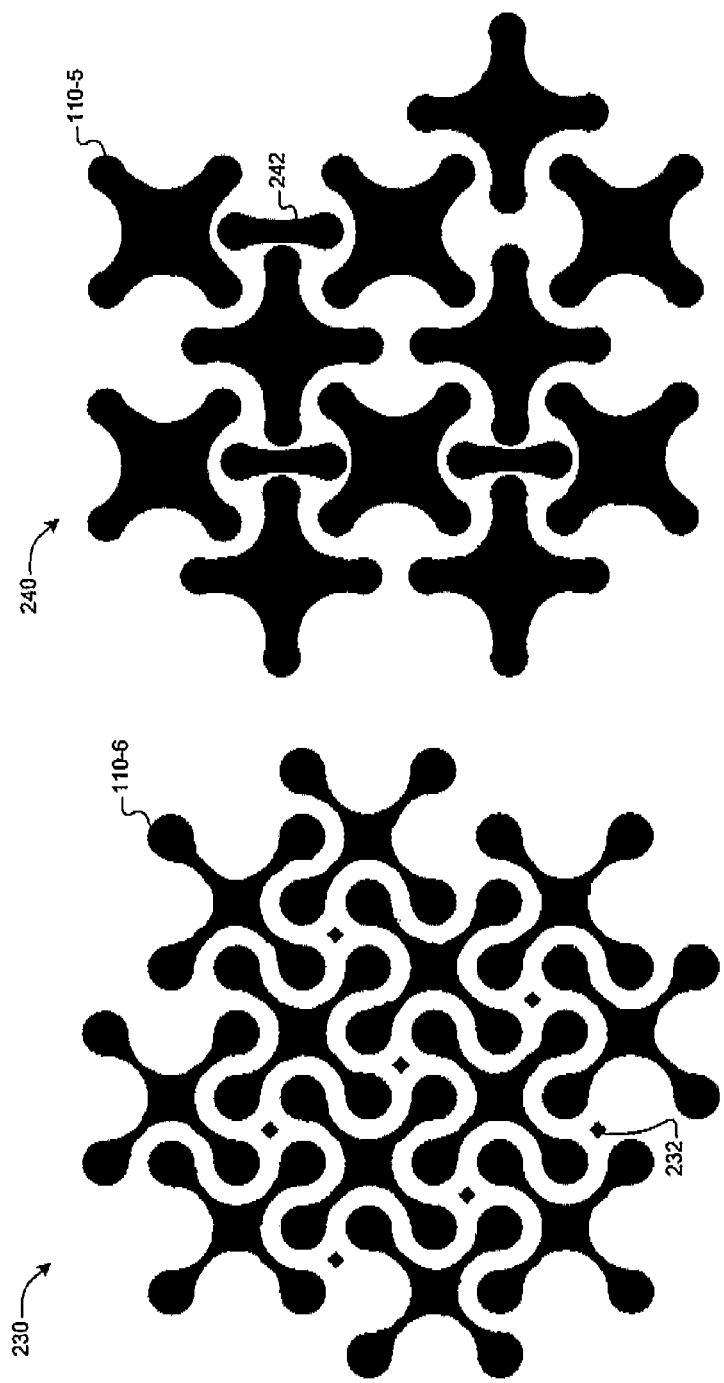

US 9,070,514 B2

HIGH DENSITY CAPACITOR ARRAY PATTERNS

TECHNICAL FIELD

The present disclosure relates to thin-film capacitors, and more particularly to substrate geometries used in thin-film capacitors that may be included in, for example, an implantable medical device.

BACKGROUND

Capacitors generally include a dielectric layer sandwiched between electrodes. Thin film capacitors are generally formed over a substrate, e.g., by depositing electrodes and a dielectric as layers on or over the substrate. The substrate may include an insulating material, such as a semiconductor material, and/or a ceramic material. Thin film capacitors may provide advantages relative to other types of capacitors with respect to size and/or utilization of a space within electronic devices, such as implantable medical devices.

SUMMARY

In general, the disclosure relates to a thin film capacitor structure. A substrate having a plurality of pillars is formed, and the thin film capacitor is formed over the substrate including the pillars. The total capacitance of the thin-film capacitor is based on the number of pillars on the substrate and the capacitance associated with each of the pillars. The capacitance associated with each of the pillars depends on the surface area of each of the pillars, which in turn depends on the geometry of the pillars. Accordingly, the total capacitance of the thin-film capacitor depends on both the geometry of the pillars and the number of pillars on the substrate.

Surface area on the substrate available for formation of capacitors may be limited in some applications. Therefore, it may be desirable in applications having limited space to produce a pillar geometry that provides for an increase in capacitance per unit area of the substrate. A thin-film capacitor structure according to the present disclosure may provide for an increase in capacitance per unit area of substrate relative to more conventional pillar geometries such as circles, triangles, squares, etc.

In one feature of the present disclosure, a thin-film device system comprises a substrate and a plurality of pillars. The plurality of pillars project from a surface of the substrate. Each of the plurality of pillars have a perimeter that includes at least four protrusions that define at least four recessed regions between the at least four protrusions. Each of the at least four recessed regions of each of the plurality of pillars receives one protrusion from an adjacent one of the plurality of pillars.

In another feature of the present disclosure, a thin-film capacitor system comprises a substrate, a plurality of pillars, a first electrode, a dielectric, and a second electrode. The plurality of pillars project from a surface of the substrate. Each of the plurality of pillars has a perimeter that includes at least four protrusions that define at least four recessed regions between the at least four protrusions. Each of the at least four recessed regions of each of the plurality of pillars receives one protrusion from an adjacent one of the plurality of pillars. The first electrode is deposited in a conformal layer over the plurality of pillars. The dielectric is deposited in a conformal layer over the first electrode. The second electrode is deposited over the dielectric.

In another feature of the thin-film capacitor system, the at least four protrusions include additional protrusions from the at least four protrusions.

In another feature of the thin-film capacitor system, the at least four protrusions and the additional protrusions define a fractal-like pattern.

In another feature of the present disclosure, a method comprises masking a substrate with a masking pattern that includes a plurality of masked regions. Each of the masked regions have a perimeter that includes at least four protrusions that define at least four recessed regions between the at least four protrusions. Each of the at least four recessed regions of each of the plurality of masked regions receives one protrusion from an adjacent one of the plurality of masked regions. The method further comprises etching the substrate to define a plurality of pillars that project from a surface of the substrate, each of the plurality of pillars having the perimeter.

In another feature, the method further comprises fabricating a thin-film capacitor over the plurality of pillars.

In another feature of the present disclosure, a thin-film device system comprises a substrate, and a plurality of pillars that project from a surface of the substrate, each of the plurality of pillars having a perimeter that includes N protrusions that define N recessed regions between the N protrusions, wherein each of the N recessed regions of each of the plurality of pillars receives one protrusion from an adjacent one of the plurality of pillars, wherein each of the N protrusions of each of the plurality of pillars includes additional protrusions, wherein the N protrusions and the additional protrusions define a fractal-like pattern, and wherein N is an integer greater than two.

The details of one or more examples are set forth in the accompanying drawings and the description below. Other features, objects, and advantages will be apparent from the description and drawings, and from the claims.

BRIEF DESCRIPTION OF DRAWINGS

FIG. 7A illustrates an array of the four-arm pillars of FIG. 6C according to the present disclosure.

FIG. 7B illustrates an array of the four-arm pillars of FIG. 6B according to the present disclosure.

DETAILED DESCRIPTION

Figure 1A:
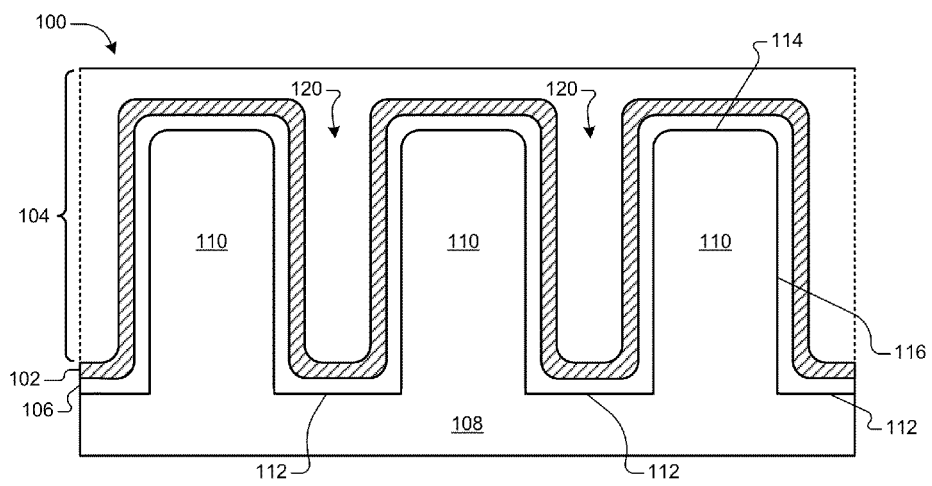
FIG. 1A is a cross-sectional view of a thin-film capacitor structure according to the present disclosure.

FIG. 1A illustrates a cross-sectional view of a thin-film capacitor 100. The thin-film capacitor 100 includes a dielectric layer 102 (hashed region) between a top electrode 104 and a bottom electrode 106. The thin-film capacitor 100 is fabricated on a substrate 108. The substrate 108 may include various materials. For example, the substrate 108 may include at least one of an insulating material, a semiconductor material such as silicon, and a ceramic material. The thin-film capacitor 100 may be connected to an electronic circuit by connecting the top and bottom electrodes 104, 106 to the electronic circuit.

The substrate 108 includes pillars 110 that extend from a top surface 112 of the substrate 108. The pillars 110 include plateaus 114 and sidewalls 116. The pillars 110 of FIG. 1A are illustrated as being formed from the same material as the substrate 108. However, in other implementations, the pillars 110 may be formed using different materials than the substrate 108. For example, the pillars 110 may be formed using poly-silicon. The pillars 110 may be formed using a masking and etching process. For example, the masking and etching process may include masking the substrate 108 with a photoresist pattern generated using photolithographic techniques, followed by etching (e.g., plasma etching) of the substrate 108 to form the pillars 110.

Figure 1B:
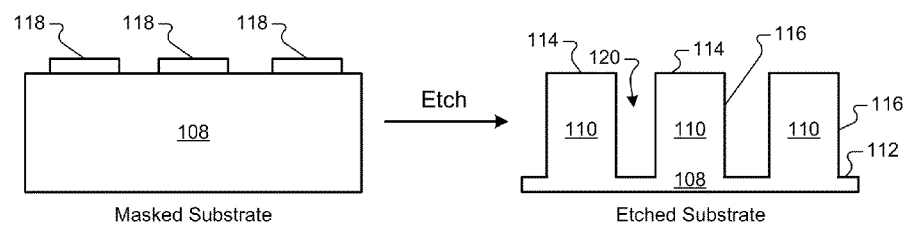
FIG. 1B illustrates an example masking and etching process used to form pillars on a substrate.

FIG. 1B illustrates an example masking and etching process used to form the pillars 110 of FIG. 1A. In general, the pillars 110 may be formed in the substrate 108 by etching the substrate 108 after a masking step. For example, FIG. 1B illustrates application of a masking pattern 118 over the substrate 108. The masking pattern 118 may be formed on the substrate 108 using photolithographic techniques. The substrate 108, including the masking pattern 118, may be etched using various etching techniques, for example, plasma etching. Following the etching of the substrate 108 and removal of the masking pattern 118, the substrate 108 includes the pillars 110.

Gaps between adjacent pillars 110 may be referred to as trenches 120. The bottom of the trenches 120 may also be referred to as the top surface 112 of the substrate 108. Accordingly, the pillars 110 project from the top surface 112 of the substrate 108. Generally, an anisotropic etching process may etch the substrate 108 so that the sidewalls 116 of the pillars 110 are perpendicular to the top surface 112 of the substrate 108. For example only, the trenches 120 may be in the range of 10-40 μm deep.

Referring back to FIG. 1A, the thin-film capacitor 100 may be formed through deposition of the bottom electrode 106, followed by deposition of the dielectric layer 102, followed by deposition of the top electrode 104. The top and bottom electrodes 104, 106 may include various materials. For example, the top and bottom electrodes 104, 106 may include conductive materials such as TiN and doped polysilicon. The top and bottom electrodes 104, 106 may be deposited using various deposition techniques, including chemical vapor deposition and physical vapor deposition. The dielectric layer 102 may include various dielectric materials, depending on the application in which the thin-film capacitor 100 may be used. For example, the dielectric layer 102 may include at least one of silicon dioxide, silicon nitride, or a high-k dielectric material.

The bottom electrode 106 may be deposited in a conformal layer over the substrate 108. In other words, the bottom electrode 106 may conform to the pillars 110 and the top surface 112 of the substrate 108. For example, in FIG. 1A, the bottom electrode 106 is deposited on the plateaus 114 of the pillars 110, the sidewalls 116 of the pillars 110, and the top surface 112 of the substrate 108.

The dielectric layer 102 is deposited over the bottom electrode 106. The dielectric layer 102 may be deposited in a conformal layer over the bottom electrode 106. In other words, the dielectric layer 102 may conform to the bottom electrode 106, and accordingly, the pillars 110.

The top electrode 104 is deposited over the dielectric layer 102. The dielectric layer 102 may be deposited using any of the electrode deposition techniques listed above, or any other suitable electrode deposition technique. In FIG. 1A, the top electrode 104 is illustrated as completely filling the trenches 120 and covering the pillars 110, although the top electrode 104 may also be deposited to conform to the dielectric layer 102 (i.e., the pillars 110) as a thin-film that does not completely fill the trenches 120.

The total capacitance of the thin-film capacitor 100 is based on the number of pillars 110 on the substrate 108 and the capacitance associated with each of the pillars 110. In turn, the capacitance associated with each of the pillars 110 depends on the geometry of the pillars 110. Accordingly, the total capacitance of the thin-film capacitor 100 depends on both the geometry of the pillars 110 and the number of pillars 110 on the substrate 108.

Surface area on the substrate 108 available for formation of capacitors may be limited in some applications. Therefore, it may be desirable in applications having limited space to produce a pillar geometry that provides for an increase in capacitance per unit area of the substrate 108. A thin-film capacitor structure according to the present disclosure provides for an increase in capacitance per unit area of substrate relative to more conventional pillar geometries such as circles, triangles, squares, etc. Capacitance associated with each of the pillars 110 of FIG. 1A is dependent mostly on the surface area of the side walls 116 of the pillars 110. In other words, capacitance associated with the plateaus 114 of the pillars 110 and the bottom of the trenches 120 may be considered to be negligible relative to the capacitance associated with the sidewalls 116 of the pillars 110. The surface area of the side walls 116 depends on the etch depth of the trenches 120 (i.e., the height of the pillars 110) and the length of the perimeter of the pillars 110. Specifically, capacitance of the thin-film capacitor 100 is directly related to the product of the etch depth and the length of the perimeter of all of the pillars 110 on the substrate 108.

For a given etch depth, the capacitance of a thin-film capacitor may be adjusted by adjusting the total length of perimeters of pillars on the thin-film capacitor. It follows that increasing a total length of perimeter included in a given surface area of a substrate will increase the total capacitance per unit area in that given surface area. Relative to typical pillar structures such as circles, triangles, squares, etc, the thin-film capacitor structures according to the present disclosure increase a total length of perimeter included in a given surface area of substrate in order to increase an amount of available capacitance per unit area of the substrate.

Thin-film capacitor structures of the present disclosure provide for a greater capacitance per unit area of substrate than typical pillar structures. Specifically, structures of the present disclosure increase the total perimeter of the pillars per unit area of substrate in order to increase capacitance per unit area of the substrate. In one implementation, pillars having four or more protrusions interlock with one another on the substrate. For example, the pillars having four or more protrusions may have each of their protrusions surrounded by protrusions from adjacent pillars. Furthermore, the interlocked pillars may include additional geometry that increases the total perimeter of the pillars. For example, protrusions of the pillars may include further protrusions or recesses that further increase the perimeter of the pillars (e.g., in FIG. 5A).

Figure 2:
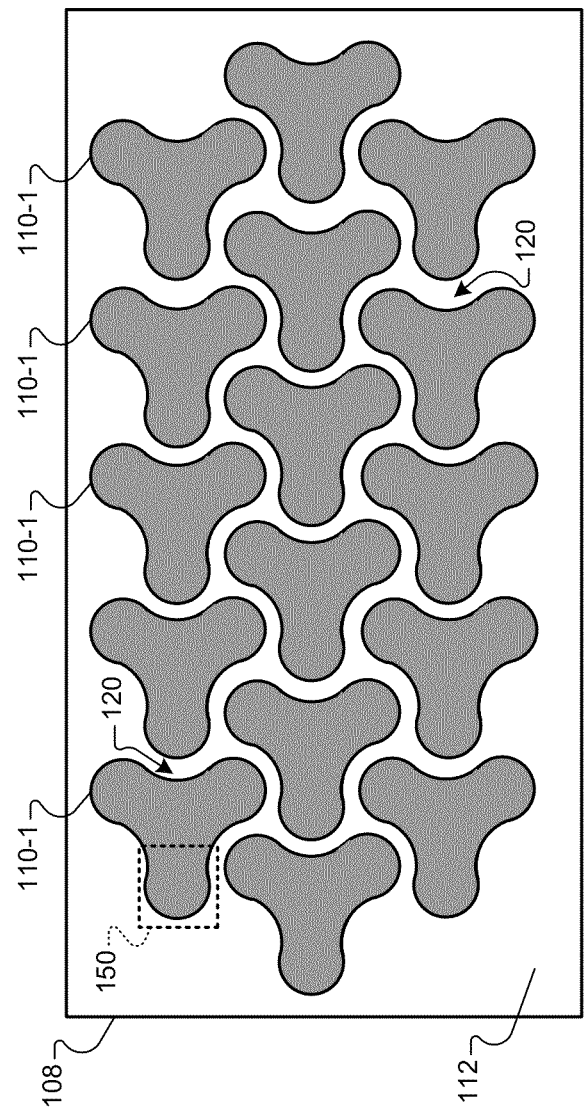
FIG. 2 illustrates an example pillar geometry as viewed from above the top surface of the substrate.

The shaded areas in FIG. 2 illustrate an example pillar geometry as viewed from above the top surface 112 of the substrate 108. The substrate 108 as shown in FIG. 2 is not covered with the dielectric layer 102 and the top and bottom electrodes 104, 106. The pillars of FIG. 2 are labeled as 110-1 to denote the example pillar geometry as shown in FIG. 2, and to differentiate the pillars 110-1 of FIG. 2 with other pillar geometries to be described hereinafter. Since the pillars 110-1 of FIG. 2 project perpendicularly from the top surface 112 of the substrate 108, a cross-section of the pillars 110-1 have the same shape as the shaded areas.

The pillars 110-1 may be formed from the masking and etching process described above and illustrated in FIG. 1B. The masking pattern 118 used in the etching process may resemble the shaded area of FIG. 2. Accordingly, the shaded area of FIG. 2 may also illustrate an example masking pattern that may be used to form the pillars 110-1.

The perimeter of each of the pillars 110-1 includes 3 protrusions. For illustration purposes, one of the protrusions 150 of a single pillar 110-1 is surrounded with a dashed box. The pillars 110-1 of FIG. 2 may be referred to as "triangular pillars 110-1" since three protrusions are visible on each of the pillars 110-1 when viewed from above the top surface 112 of the substrate 108. The trench 120 is defined by each of the pillars 110-1. Accordingly, the trench 120 may be a continuous trench formed around each of the pillars 110-1 on the substrate 108. The trench 120 is illustrated in FIG. 2 as the white space between each of the pillars 110-1. In the event that pillars 110-1 are not completely etched, the trench 120 may be a substantially continuous trench.

Figure 3B:
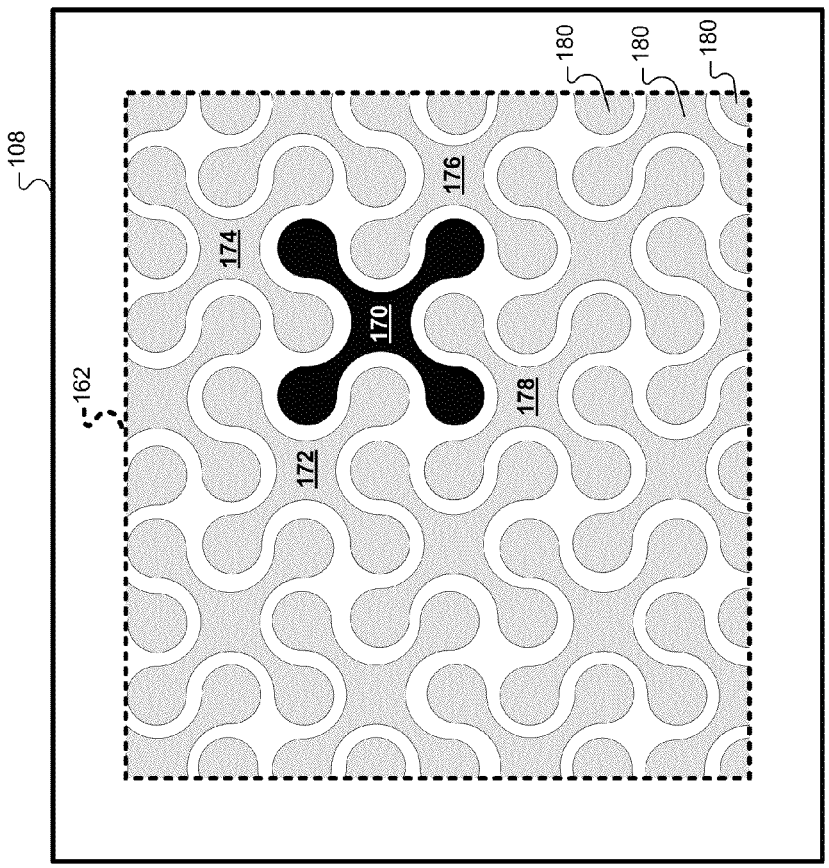
FIG. 3B illustrates an array of four-arm pillars formed on the substrate according to the present disclosure.
Figure 3A:
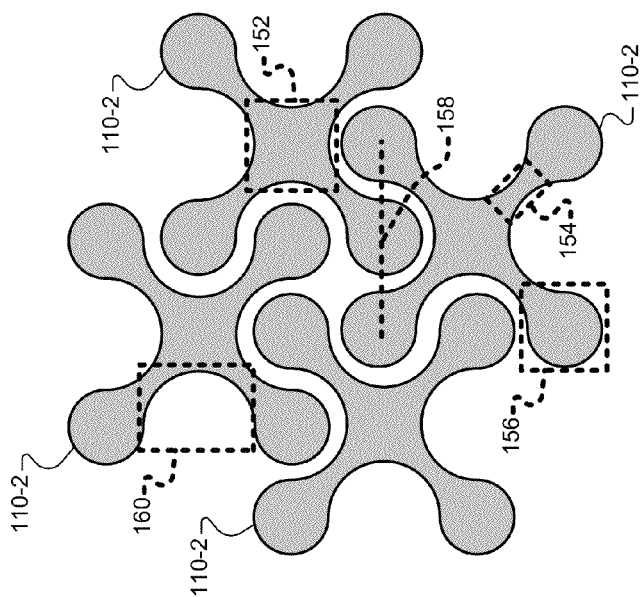
FIG. 3A illustrates an example four-arm pillar geometry according to the present disclosure.

Referring now to FIG. 3A, the shaded areas illustrate example pillar geometries according to the present disclosure. The pillars of FIG. 3A have four protrusions. Pillars having four protrusions may be referred to hereinafter as "four-arm pillars 110-2." For example only, protrusions on the four-arm pillars 110-2, 110-3, 110-4, 110-5, and 110-6 to be described in detail may be approximately 1 μm in length. Distances between pillars may be in the range of hundreds of nanometers. Film thicknesses for the top electrode 104, the bottom electrode 106, and the dielectric layer 102 may be on the order of tens to hundreds of nanometers.

FIG. 3A illustrates four interlocking four-arm pillars 110-2. Each four-arm pillar 110-2 includes a center region 152 from which four arms protrude. For example, the four arms may be equally spaced around the center region 152. Each of the arms includes a middle-arm region 154 that may be narrower relative to an end region 156. The four-arm pillars 110-2 may be arranged relative to one another such that the four-arm pillars 110-2 "interlock." Interlocking of the four-arm pillars 110-2 refers to the ability of one arm of one of the four-arm pillars 110-2 to fit between two arms of another one of the four-arm pillars 110-2. Specifically, an end region 156 of one arm may be positioned between two end regions 156 of another arm. Interlocking of two four-arm pillars 110-2 is illustrated by the dotted line 158 showing one end region of one four-arm pillar 110-2 positioned between two end regions of another four-arm pillar 110-2.

Interlocking of two four-arm pillars 110-2 may also be described as follows. A recessed region, illustrated at 160 by the dashed box, is formed between two end regions 156 of a four-arm pillar 110-2. Two four-arm pillars 110-2 may be interlocked when an end region of one of the two four arm pillars 110-2 is positioned within a recessed region of the other four-arm pillar 110-2.

FIG. 3B illustrates an array 162 of four-arm pillars 110-2 formed on the substrate 108. The four-arm pillars 110-2 may be formed using the masking and etching process described above and illustrated in FIG. 1B. The masking pattern used in the etching process may be the same as the shaded area of FIG. 3B. Accordingly, the shaded area of FIG. 3B may also illustrate an example masking pattern that may be used to form the pillars 110-2. The white space between each of the four-arm pillars 110-2 forms a continuous trench that surrounds each of the four-arm pillars 110-2 in the array 162.

FIG. 3B illustrates how a plurality of four-arm pillars 110-2 may be interlocked. The black four-arm pillar 170 (white numbering) is used for illustration purposes to describe generally how the four-arm pillars 110-2 interlock. Each arm of the black four-arm pillar 170 is positioned between, i.e., in the space that separates, two arms of adjacent four-arm pillars 172, 174, 176, 178. In other words, a line may be drawn from one arm of four-arm pillar 172 to another arm of four-arm pillar 172 that intersects the arm of the black four-arm pillar 170 that positioned between the two arms. Furthermore, each of the recessed regions between the arms of the black four-arm pillar 170 includes an arm from one of the adjacent four-arm pillars 172, 174, 176, 178.

Capacitance of a thin-film capacitor formed from a substrate that includes an array of four-arm pillars 110-2 may be determined based on the number of four-arm pillars 110-2 on the substrate. For example, the capacitance of a thin-film capacitor formed from a substrate that includes an array of four-arm pillars 110-2 may be determined by multiplying the number of four-arm pillars 110-2 by the capacitance associated with each of the four-arm pillar 110-2. Additional calculations to determine capacitance associated with a thin-film capacitor formed from the array 162 of four-arm pillars 110-2 may be performed when the substrate includes partial pillars, as illustrated at 180. For example, the perimeters of the partial pillars 180 may be taken into account by adding the capacitance associated with the perimeters of the partial pillars to the capacitance of the thin-film capacitor due to four-arm pillars 110-2 having a complete perimeter.

In some implementations, the array 162 of four-arm pillars 110-2 may form a single thin-film capacitor. Accordingly, multiple arrays 162 of four-arm pillars 110-2 may be fabricated on a substrate to form multiple capacitors. Since the number of four-arm pillars 110-2 included in an array determines the capacitance of the array, multiple arrays of pillars 110-2 may have different capacitances based on the number of four-arm pillars 110-2 included in each of the arrays.

Alternatively or additionally, a single array of four-arm pillars 110-2 may be selectively etched so that a first portion of the single array forms a first capacitor and a second portion of the single array forms a second capacitor. Accordingly, a single array of four-arm pillars 110-2, as illustrated in FIG. 3B may be etched to form 2 or more capacitors.

Figure 4:
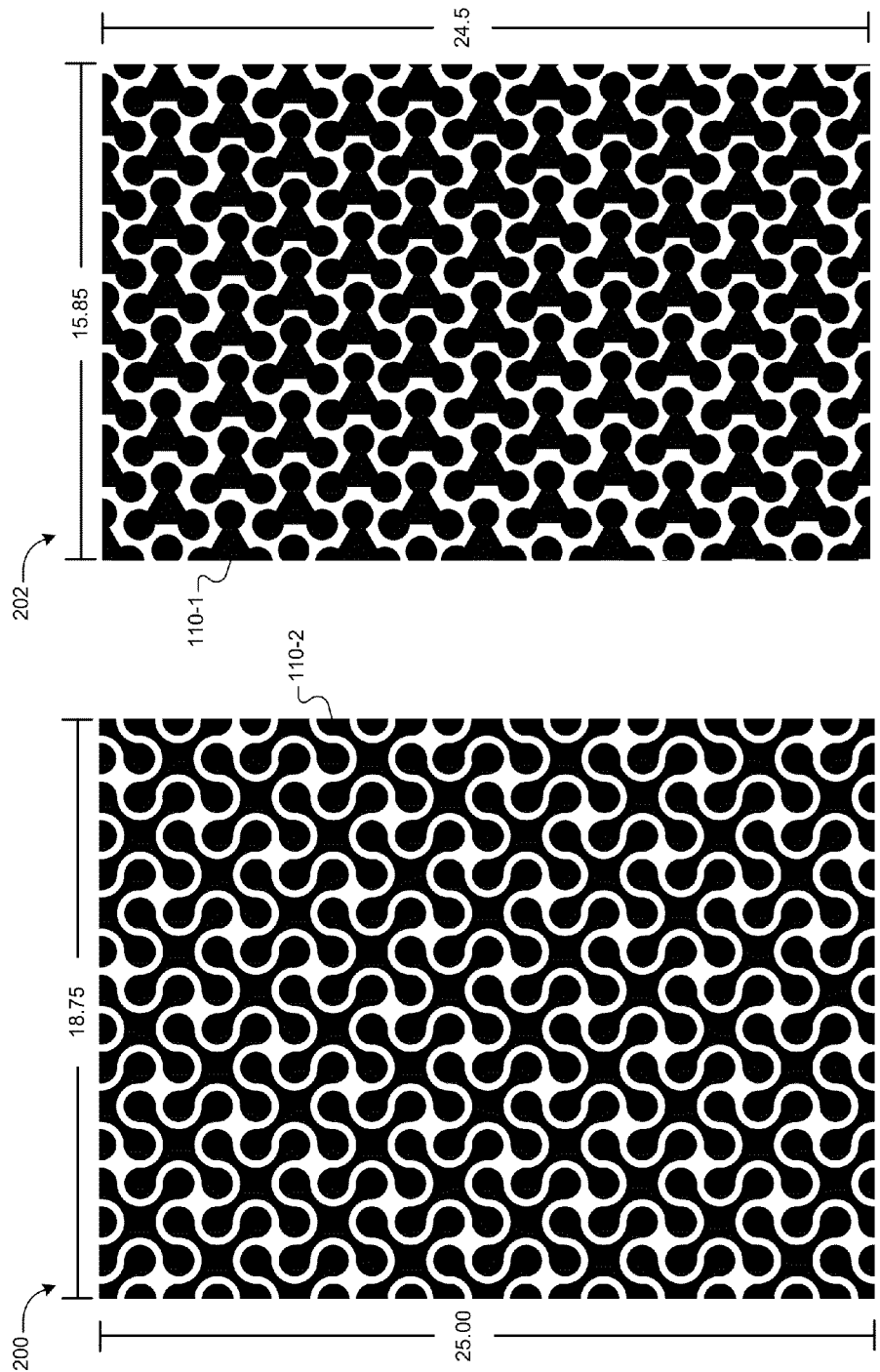
FIG. 4 illustrates a comparison between an array of four-arm pillars according to the present disclosure and an array of triangular pillars.

FIG. 4 illustrates a comparison between an array 200 of four-arm pillars 110-2 and an array 202 of triangular pillars 110-1. Specifically, FIG. 4 aids in comparison of the perimeter per unit area that is achievable for each of the arrays 200, 202. Arbitrary units are used to measure length for the comparison.

Each of the four-arm pillars 110-2 and the triangular pillars 110-1 of FIG. 4 has an approximate perimeter length of 18.84 units and 7.17 units, respectively. The array 200 of four-arm pillars 110-2 and the array 202 of triangular pillars 110-1 are 25.00×18.75 units2 and 24.5×15.85 units2, respectively. The array 200 includes approximately 60 full perimeters of four-arm pillars 110-2. The array 202 includes approximately 84 full perimeters of triangular pillars 110-1. The array 200 of four-arm pillars 110-2 includes approximately 1130.40 units of perimeter and the array 202 of triangular pillars 110-1 includes approximately 602.28 units of perimeter. Accordingly, the array 200 of four-arm pillars 110-2 includes 2.41 units of perimeter per unit2 and the array 202 of triangular pillars 110-1 includes 1.55 units of perimeter per unit2. Therefore, the arrangement of four-arm pillars 110-2 includes approximately 1.55 times as much perimeter per square unit of area. In other words, a thin-film capacitor including the four-arm pillars 110-2 instead of the triangular pillars 110-1 would have approximately 1.55 times the amount of capacitance per unit area.

Figure 5B:
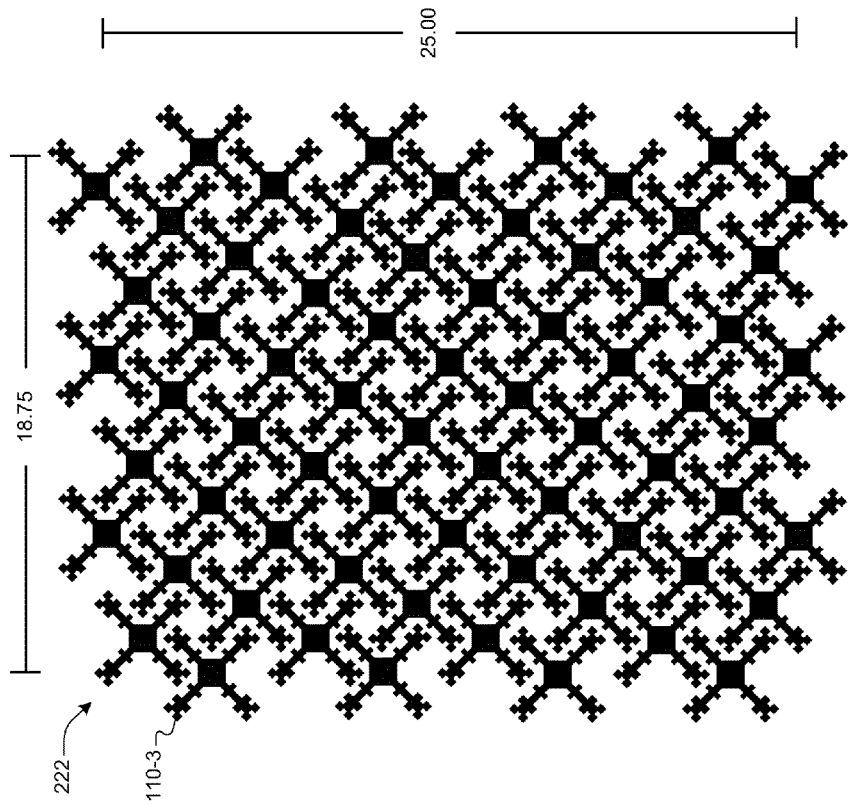
FIG. 5B illustrates an array of the four-arm pillars of FIG. 5A according to the present disclosure.
Figure 5A:
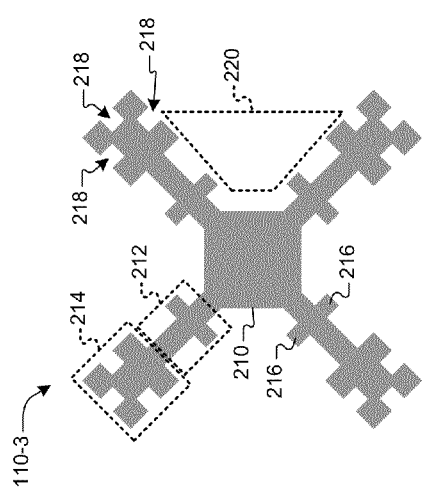
FIG. 5A illustrates another example four-arm pillar geometry according to the present disclosure.

FIG. 5A shows another example four arm pillar geometry according to the present disclosure, hereinafter "four-arm pillar 110-3," that is similar to the four-arm pillar 110-2 of FIG. 3A in some respects. For example, the four-arm pillar 110-3 includes four arms that protrude from a center region 210, similar to that of the four-arm pillar 110-2 of FIG. 3A. Additionally, the four arms of the four-arm pillar 110-3 are sized and arranged to allow for an interlocking of the four-arm pillars 110-3 to form an array as shown in FIG. 5B.

Although the four-arm pillar 110-3 of FIG. 5A is similar to the four-arm pillar 110-2 of FIG. 3A, the four-arm pillar 110-3 differs from the four-arm pillar 110-2 in some respects, as described hereinafter.

The four-arm pillar 110-3 includes substantially straight edges and approximately ninety degree angles instead of the curved edges found on the four-arm pillar 110-2. Accordingly, a four-arm pillar structure may include curved edges only (e.g., four-arm pillar 110-2) or straight edges only (e.g., 110-3). In some implementations, the perimeter of the four-arm pillar structures may include both straight and curvilinear portions.

Each of the 4 arms of the four-arm pillar 110-3 includes a middle-arm region 212 and an end region 214. The middle-arm region 212 and the end region 214 each include geometry (i.e., additional protrusions) that increases the perimeter of the four-arm pillar 110-3. The middle-arm region 212 includes two protrusions 216 that increase the perimeter of the four-arm pillar 110-3. The end region 214 defines 3 subtracted sections 218 (i.e., additional recessed regions) that increase the perimeter of the four-arm pillar 110-3. Although the protrusions 216 and subtractions 218 are illustrated as having a rectangular shape, other shapes are contemplated. For example, the subtractions 218 and the protrusions 216 may include curvilinear shapes, such as semicircles. In some examples, the subtractions 218 and protrusions 216 may include any combination of curvilinear and/or linear shapes. A recessed region, illustrated at 220 by the dashed box, is formed between two middle-arm and end regions 212, 214 of the four-arm pillar 110-3.

In some implementations, additional protrusions and subtracted sections may be arranged around a four-arm pillar structure in order to create a fractal-like pattern. For example, a four-arm pillar structure having a fractal-like pattern may have additional protrusions that appear as a reduced copy of the whole four-arm pillar pattern. Limitations on device fabrication and feature size may limit the resolution of the fractal-like pattern.

FIG. 5B shows an array 222 of the four-arm pillars 110-3. The four arm pillars 110-3 are interlocked in a similar manner as the four-arm pillars 110-2 of FIGS. 3A, 3B, and 4. In other words, each arm of the four-arm pillars 110-3 is positioned between two arms of an adjacent four-arm pillar 110-3. Additionally, each recessed region 220, except the recessed regions 220 on the perimeter of the array 222, of each four-arm pillar 110-3 includes an end region 214 of another four-arm pillar 110-3.

FIG. 5B aids in comparison of the perimeter per unit area achievable for the four-arm pillar 110-3 and the triangular pillar 110-1. Arbitrary units are used to measure length for the comparison. Each of the four-arm pillars 110-3 has an approximate perimeter length of 32.88 units. The array 222 of four-arm pillars 110-3 has an area of approximately 18.75× 25.00 units2. The array 222 of four-arm pillars 110-3 includes approximately 1972.8 units of perimeter since the array 222 includes approximately 60 four-arm pillars 110-3. Accordingly, the array 222 of four-arm pillars 110-3 includes 4.21 units of perimeter per unit2. Therefore, the arrangement of four-arm pillars 110-3 includes approximately 2.72 times (i.e., 4.21/1.55) as much perimeter per unit2 as the triangular pillar 110-1 of FIG. 3. In other words, a thin-film capacitor including the four-arm pillars 110-3 instead of the triangular pillars 110-1 would have approximately 2.72 times the amount of capacitance per unit area.

Figure 6A:
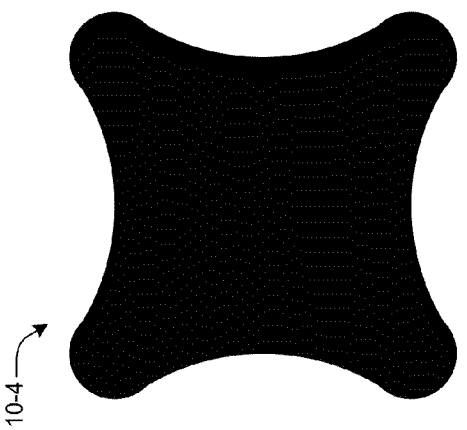
FIG. 6A illustrates another example four-arm pillar geometry according to the present disclosure.
Figure 6B:
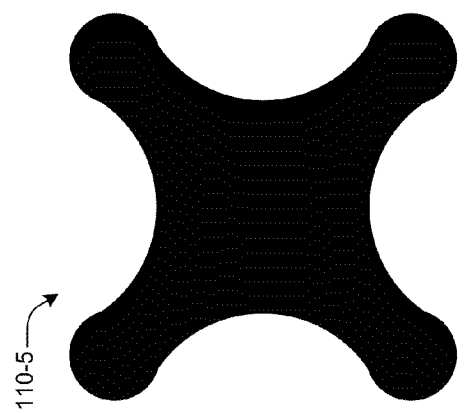
FIG. 6B illustrates another example four-arm pillar geometry according to the present disclosure.
Figure 6C:
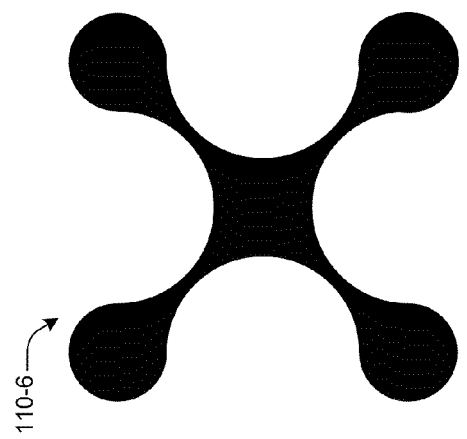
FIG. 6C illustrates another example four-arm pillar geometry according to the present disclosure.

FIGS. 6A-6C show variations in the shape of the four-arm pillar structure. Specifically, the center region, middle-arm region, and end regions of the four-arm pillar structure may vary in shape and size. FIG. 6A shows a four-arm pillar 110-4 that includes a relatively large center region, a shorter middle-arm region, and a shorter end region as compared to the four-arm pillar 110-2 of FIG. 3A. The center region of the four-arm pillar 110-5 of FIG. 6B is relatively larger than the center region of the four-arm pillar 110-2 of FIG. 3A, and the middle-arm region of FIG. 6B is relatively shorter than the middle-arm region of the four-arm pillar 110-2 of FIG. 3A. FIG. 6C illustrates a four-arm pillar 110-6 having a relatively smaller center region and elongated middle-arm region relative to the four-arm pillar 110-2 of FIG. 3A.

The relative size of the center region, middle-arm region, and end region of the four-arm pillar structure may affect how dense the four-arm pillar structures will pack in an array. In other words, the size of the regions of a four-arm pillar structure may affect a total amount of capacitance that may be achieved per unit area of substrate.

FIG. 7A shows an example array 230 of four-arm pillars 110-6 as shown in FIG. 6C. The four-arm pillars 110-6 interlock with one another. Shown in FIG. 7A are secondary pillars 232 that are added to the array 230 to utilize available space between the four-arm pillars 110-6. The secondary pillars 232 provide additional capacitance to the array 230. The secondary pillars 232 shown have a square perimeter. Although the secondary pillars 232 of FIG. 7A have a square perimeter, secondary pillars may have a variety of perimeter shapes. For example, secondary pillars may have any combination of straight and/or curvilinear perimeters.

FIG. 7B shows an example array 240 of four-arm pillars 110-5 as shown in FIG. 6B. The four-arm pillars 110-5 interlock with one another, albeit to a lesser degree than the four-arm pillars 110-2, 110-3, and 110-6. In other words, end regions of the arms of the four-arm pillars 110-5 do not fit as well into recesses of other four-arm pillars 110-5. Shown in FIG. 7B are secondary pillars 242 that are added to the array 240 to utilize available space between the four-arm pillars 110-5 and create more capacitance in the array 240. The secondary pillars 242 are curvilinear in shape, in contrast to the linear secondary pillars 232.

Figure 8:
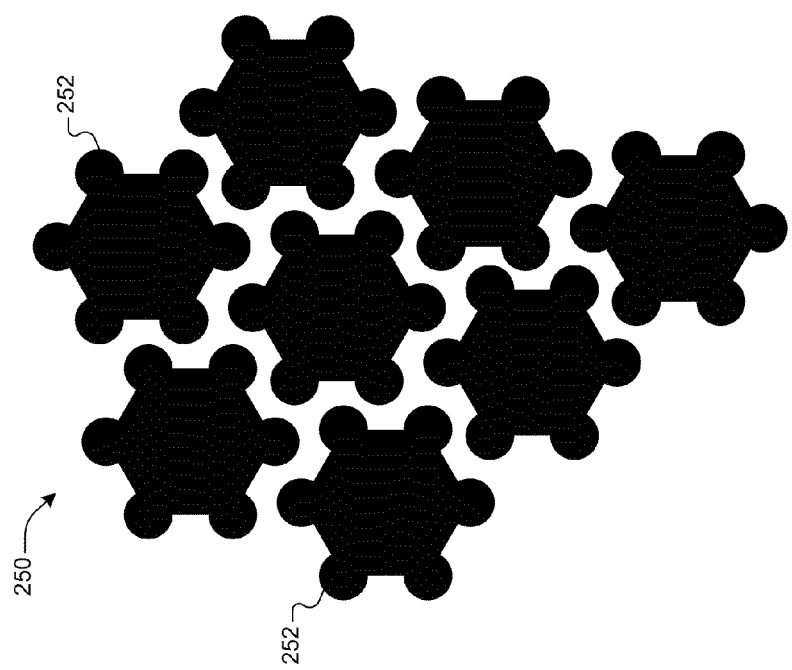
FIG. 8 illustrates an example array of six-arm pillars according to the present disclosure.

FIG. 8 illustrates an example array 250 of six-arm pillars 252. The array 250 of six-arm pillars 252 may provide an improvement in capacitance per unit area over the array 202 of triangular pillars 110-1. The six-arm pillars 252 may interlock with one another, albeit to a lesser degree than the four-arm pillars 110-2, 110-3, 110-5, and 110-6. In other words, protrusions on one six-arm pillar 252 may not fit as well within the recesses between protrusions on another six-arm pillar 252, as compared to the four arm pillars 110-2, 110-3, 110-5, and 110-6.

The four-arm pillars 110-2, 110-3, 110-4, 110-5, 110-6 and the six-arm pillar 252 include multiple axes of symmetry. For example, all of the four-arm pillars shown include four axes of symmetry, while the six-arm pillar 252 includes more than four axes of symmetry. Although the four-arm pillars 110-2, 110-3, 110-4, 110-5, 110-6 and the six-arm pillar 252 have axes of symmetry, an axis of symmetry is not required to achieve an increase in capacitance per unit area of substrate according to the present disclosure. For example, the additional protrusions 216 and the subtracted sections 218 on the four-arm pillar 110-3 of FIG. 5A may each have a different shape that results in a loss of symmetry of the four-arm pillar 110-3, while maintaining the capacitance per unit area associated with the four-arm pillar 110-3.

Figure 9:
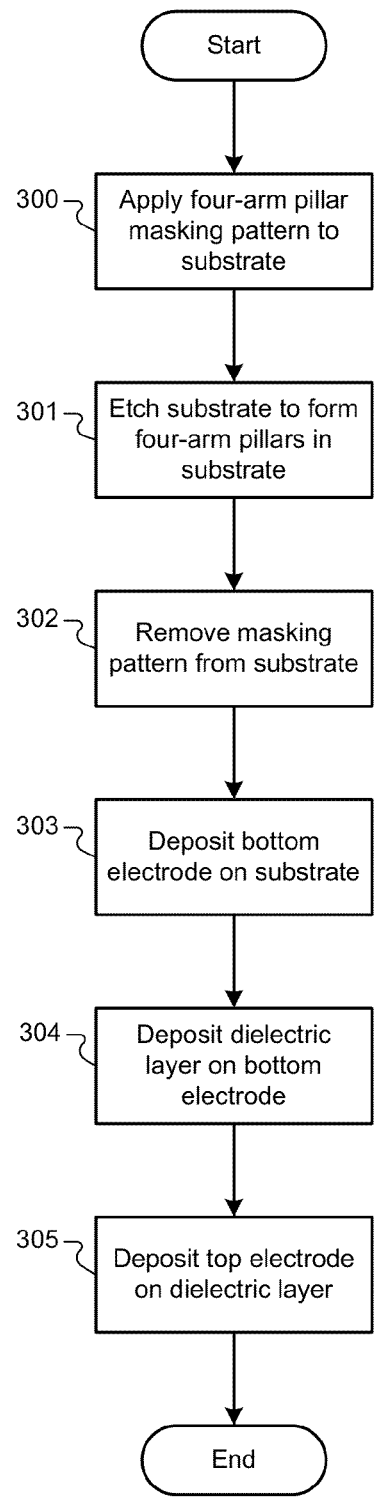
FIG. 9 is a flow diagram illustrating an example method for fabricating a thin-film capacitor structure according to the present disclosure.

Referring now to FIG. 9, an example method for fabricating a thin-film capacitor structure according to the present disclosure is shown. According to the illustrated example, a four-arm pillar masking pattern is applied to a substrate (300). For example, the four-arm masking pattern may resemble arrays of four-arm pillars 110-2, 110-3, 110-5, and 110-6 as shown in FIGS. 4, 5B, 7B, and 7A, respectively. The masking pattern may also be an array of other four arm pillar geometries, such as pillars 110-4.

The substrate is etched to form an array of four-arm pillars in the substrate (301). Example arrays 200, 222, 230, and 240 of four-arm pillars are illustrated in FIGS. 4, 5B, 7A, and 7B, respectively. The portion of the masking pattern remaining on the plateaus 114 of the four-arm pillars is removed (302). The bottom electrode 106 is deposited on the substrate 108 (303). The dielectric layer 102 is deposited on the bottom electrode 106 (304). The top electrode 104 is deposited on the dielectric layer 102 (305).

Thin-film capacitor structures according to the present disclosure may be included on an integrated circuit (IC) die. Various numbers and sizes of thin-film capacitors may be formed on a single IC die. Accordingly, an IC die may include one or more of the capacitor structures of the present disclosure. In some implementations, the capacitor structures may be formed on the IC die along with other digital and analog circuitry, such as logic and signal processing circuitry, or as storage for a memory device such as dynamic random access memory. In other implementations, an IC die may exclusively include the thin-film capacitor structures. For example, an IC die may include one large thin-film capacitor that covers the usable area of the IC die, or the IC die may include a plurality of separate thin-film capacitors that cover the usable area of the IC die.

An IC die including the thin-film capacitor structure of the present disclosure may be implemented in electronic systems in order to save packaging space since the thin-film capacitor structures provide for an increase in capacitance per unit area of die space. The thin-film capacitor structure may save packaging space in at least two ways. First, an IC die including thin-film capacitors may be packaged with other ICs in a stacked IC package. The capacitor IC die stacked in the IC package may effectively replace chip capacitors (e.g., surface mount capacitors), increasing usable surface area on a printed circuit board that typically would include chip capacitors. Second, the thin-film capacitor structures may reduce an overall size of an IC die that includes both capacitors and other circuitry since the area occupied by the thin-film capacitors may be reduced using structures according to the present disclosure.

A system including an implantable medical device (IMD) may benefit from using the thin-film capacitor structures of the present disclosure. IMDs have limited internal space available for components such as capacitors (e.g., surface mounted chip capacitors). Accordingly, replacing chip capacitors in an IMD with thin-film capacitors may reduce the size of the IMD, or free space in the IMD for other circuitry. In some implementations, chip capacitors used in IMDs may be replaced by a thin-film capacitor IC that is stacked in an IC package with other analog/digital circuitry, thus, saving space in the IMD for other components. A system implementing the thin-film capacitor structure of the present disclosure is now described with reference to FIGS. 10-13.

Figure 10:
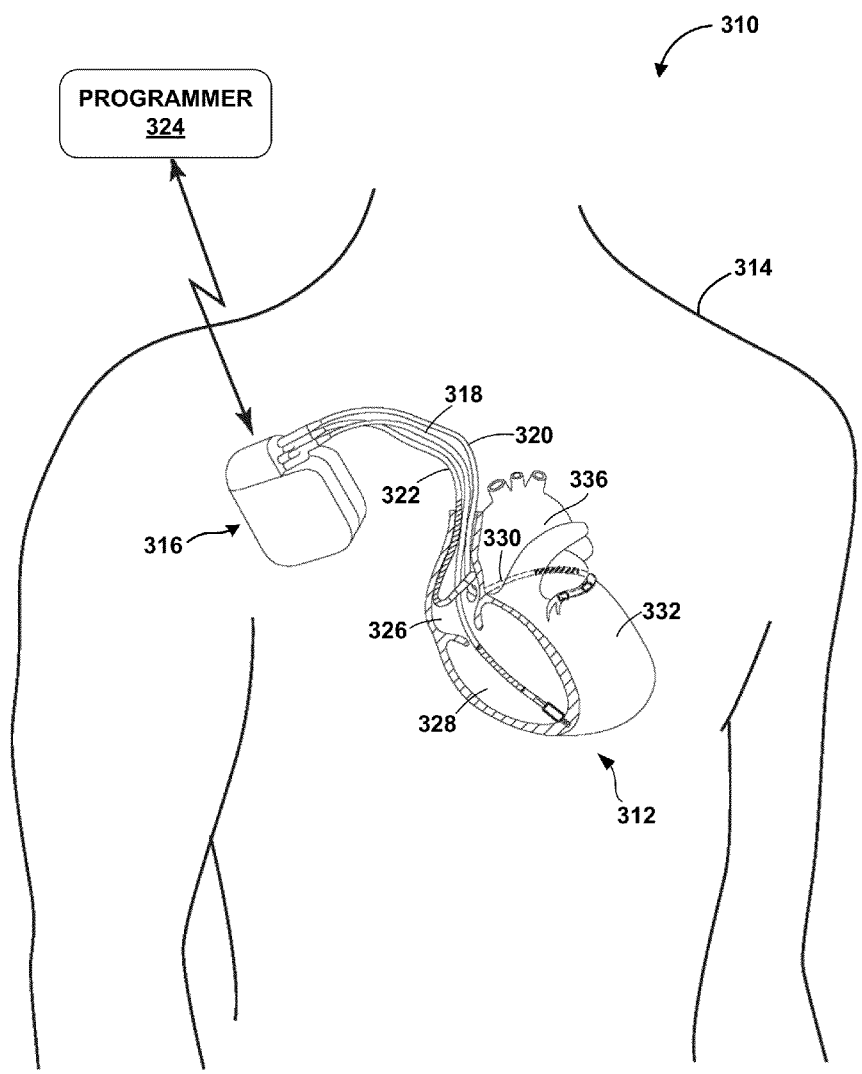
FIG. 10 is a conceptual diagram of an example system according to the present disclosure.

FIG. 10 is a conceptual diagram of an example system 310 that may be used to provide therapy to a heart 312 of a patient 314. The system 310 includes an IMD 316, which is coupled to leads 318, 320, and 322. For example, the IMD 316 may be an implantable pacemaker, cardioverter, and/or defibrillator that provides electrical signals to the heart 312 using one or more of the leads 318, 320, 322.

The leads 318, 320, 322 extend into the heart 312 of the patient 314. The leads 318, 320, 322 sense electrical activity of the heart 312 and/or deliver electrical stimulation to the heart 312. Right ventricular (RV) lead 318 extends into the right ventricle 328 of the heart 312 through one or more veins (not shown), the superior vena cava (not shown), and the right atrium 326. Left ventricular (LV) coronary sinus lead 320 extends through one or more veins, the vena cava, the right atrium 326, and into the coronary sinus 330 to a region adjacent to the free wall of left ventricle 332 of the heart 312. Right atrial (RA) lead 322 extends into the right atrium 326 of the heart 312 through one or more veins and the vena cava.

The system 310 includes a programmer 324 that communicates with the IMD 316. The programmer 324 may be a handheld computing device, a desktop computing device, a networked computing device, etc. The programmer 324 may retrieve data stored in the IMD 316 and/or program the IMD 316 to provide various therapies. Accordingly, a user may retrieve data from the IMD 316 and program the IMD 316 using the programmer 324. For example, the user may include a physician, a technician, a surgeon, an electrophysiologist, or other clinician.

The IMD 316 and the programmer 324 may communicate via wireless communication using any techniques known in the art. Examples of communication techniques may include, for example, low frequency or radiofrequency (RF) telemetry, but other techniques are also contemplated.

Figure 11:
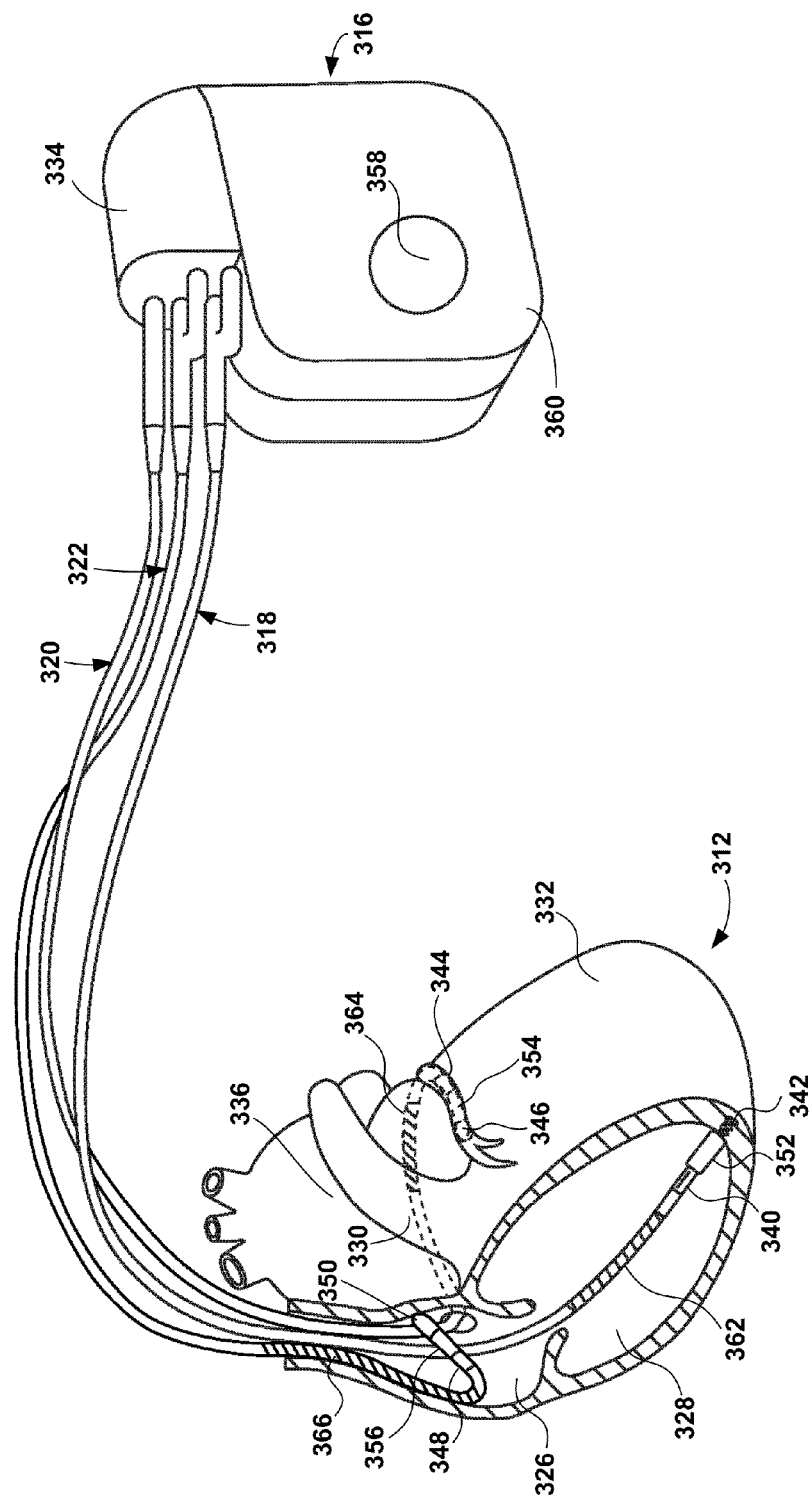
FIG. 11 is a conceptual diagram illustrating an implantable medical device and leads of the system of FIG. 10 according to the present disclosure.

FIG. 11 is a conceptual diagram illustrating the IMD 316 and the leads 318, 320, 322 of the system 310 in greater detail. The IMD 316 includes a housing 360 and a connector block 334. The leads 318, 320, 322 are mechanically and electrically coupled to the IMD 316 via the connector block 334. The housing 360 may enclose a signal generator that generates therapeutic stimulation, such as cardiac pacing pulses and defibrillation shocks, as well as a sensing module for monitoring the rhythm of the heart 312. The leads 318, 320, 322 are coupled to a signal generator and a sensing module of the IMD 316 via the connector block 334. The IMD 316 may sense electrical signals attendant to the depolarization and repolarization of the heart 312 via the leads 318, 320, 322. The IMD 316 may also provide electrical stimulation to the heart 312 via the leads 318, 320, 322.

The housing 360 may include electronic components that implement the signal generator and sensing module. The electronic components may include integrated and/or discrete components mounted on a printed circuit board or other support. An IC including thin-film capacitor structures according to the present disclosure may be stacked within other IC packages in the housing 360 in order to reduce an amount of space used in the housing 360 for electronic components. The thin-film capacitors may be used for conditioning (e.g., filtering and/or amplification) signals generated by the signal generator or signals received by the sensing module. In other implementations, thin-film capacitor may be implemented in the IMD 316 to store charge used to power the IMD 316 for a period of time. In still other implementations, the thin-film capacitor may be implemented in a high voltage charging circuit of the IMD 316 as described below.

The IMD 316 may provide pacing pulses to the heart 312 based on the electrical signals sensed within the heart 312. The IMD 316 may also provide defibrillation and/or cardioversion therapy to the heart 312. For example, the IMD 316 may detect arrhythmia of the heart 312, such as fibrillation of the ventricles 328 and 332, and deliver cardioversion or defibrillation therapy to heart 312 in the form of electrical pulses. In some implementations, the IMD 316 may be programmed to deliver a progression of therapies, e.g., pulses with increasing energy levels, until a tachyarrhythmia of the heart 312 is stopped. The IMD 316 may detect tachycardia or fibrillation employing one or more tachycardia or fibrillation detection techniques known in the art.

Leads 318, 320, and 322 include electrodes 340, 342, 362, 344, 346, 364, 348, 350, and 366, respectively. The IMD 316 may sense electrical signals via the electrodes 340, 342, 362, 344, 346, 364, 348, 350, and 366. The IMD 316 may also provide electrical stimulation to the heart 312 using the electrodes 340, 342, 362, 344, 346, 364, 348, 350, and 366. Although each of the leads 318, 320, 322 of FIG. 11 includes three electrodes, other configurations of electrodes are contemplated.

The IMD 316 includes a housing electrode 358, which may be formed integrally with an outer surface of the hermetically-sealed housing 360 of the IMD 316 or otherwise coupled to the housing 360. Although a single housing electrode 358 is illustrated in FIG. 11, the IMD 316 may include more or less than a single housing electrode 358.

IMD 316 may sense electrical signals attendant to the depolarization and repolarization of the heart 312 via the electrodes 340, 342, 344, 346, 348, 350, 358, 362, 364, and 366. The electrical signals are conducted to the IMD 316 from the electrodes via the respective leads 318, 320, 322 or, in the case of the housing electrode 358, a conductor coupled to the housing electrode 358. The IMD 316 may sense such electrical signals via any bipolar combination of electrodes 340, 342, 344, 346, 348, 350, 358, 362, 364, and 366. Furthermore, any of the electrodes 340, 342, 344, 346, 348, 350, 358, 362, 364, and 366 may be used for unipolar sensing in combination with the housing electrode 358.

Any multipolar combination of two or more of the electrodes 340, 342, 344, 346, 348, 350, 358, 362, 364, and 366 may be considered a sensing electrode configuration. Usually, but not necessarily, a sensing electrode configuration is a bipolar electrode combination on the same lead, such as electrodes 340 and 342 of lead 318. On a lead having three electrodes, there may be at least three different sensing electrode configurations available to the IMD 316.

In some implementations, the IMD 316 may use sensing electrode configurations having electrodes on two different leads. Further, a sensing electrode configuration may utilize housing electrode 358, which may provide a unipolar sensing electrode configuration. In other implementations, a sensing electrode configuration may comprise more than one housing electrode 358.

The IMD 316 may deliver pacing pulses via a unipolar or bipolar combination of electrodes. The IMD 316 may deliver defibrillation pulses to the heart 312 via any combination of elongated electrodes 362, 364, 366, and housing electrode 358. Electrodes 358, 362, 364, 366 may also be used to deliver cardioversion pulses to the heart 312.

Although the IMD 316 of FIG. 11 is coupled to three leads 318, 320, 322, other lead configurations are contemplated. In other words, the number of leads coupled to the IMD 316 and the locations of the leads relative to the heart 312 may vary (e.g., within the heart 312 or proximate to the heart 312).

Figure 12:
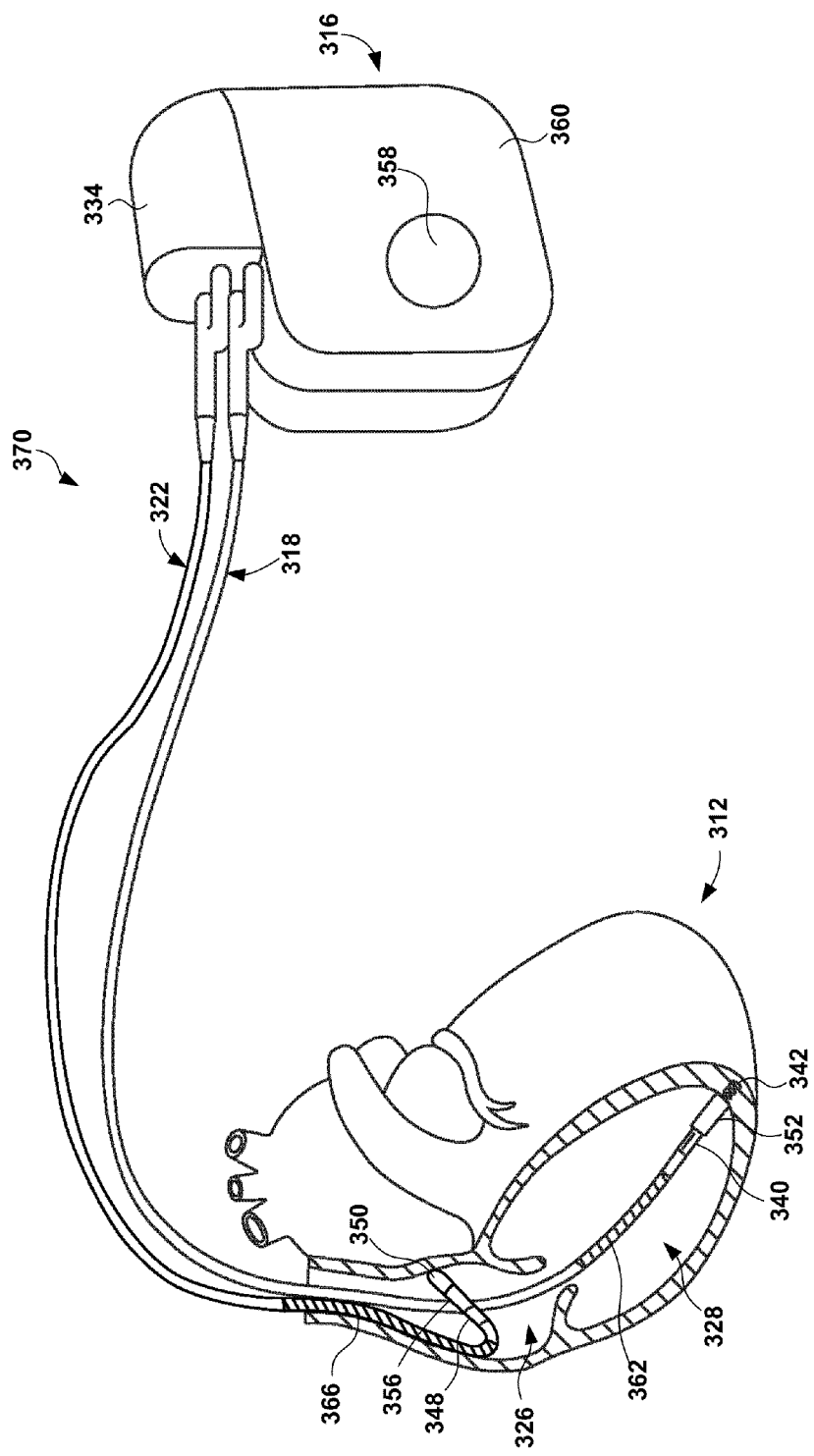
FIG. 12 is a conceptual diagram illustrating another lead configuration according to the present disclosure.

FIG. 12 is a conceptual diagram illustrating another lead configuration. A system 370, similar to the system 310, includes two leads 318, 322, rather than three leads. The leads 318, 322 are implanted within the right ventricle 328 and the right atrium 326, respectively. The system 370 shown in FIG. 12 may be useful for providing defibrillation and pacing pulses to the heart 312.

Figure 13:
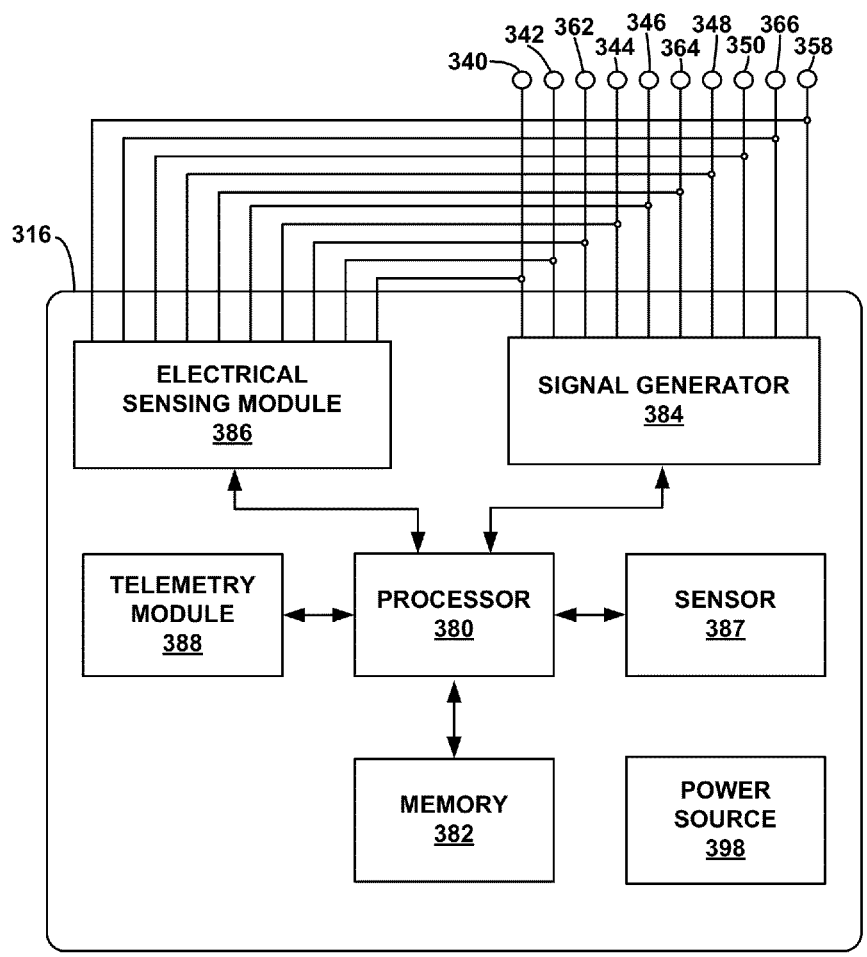
FIG. 13 is a functional block diagram illustrating an example configuration of the implantable medical device according to the present disclosure.

FIG. 13 is a functional block diagram illustrating an example configuration of the IMD 316. The IMD 316 includes a processor 380, memory 382, a signal generator 384, an electrical sensing module 386, a sensor 387, a telemetry module 388, and a power source 398. Memory 382 may include computer-readable instructions that, when executed by the processor 380, cause the IMD 316 and the processor 380 to perform various functions attributed to the IMD 316 and the processor 380 herein. Memory 382 may include any volatile, non-volatile, magnetic, or electrical media, such as a random access memory (RAM), read-only memory (ROM), non-volatile RAM (NVRAM), electrically-erasable programmable ROM (EEPROM), flash memory, or any other digital media.

The processor 380 may include any one or more of a microprocessor, a microcontroller, a digital signal processor (DSP), an application specific integrated circuit (ASIC), a field-programmable gate array (FPGA), or equivalent discrete or integrated logic circuitry. In some examples, the processor 380 may include multiple components, such as any combination of one or more microprocessors, one or more microcontrollers, one or more DSPs, one or more ASICs, or one or more FPGAs, as well as other discrete or integrated logic circuitry. The functions attributed to the processor 380 herein may be embodied as software, firmware, hardware or any combination thereof.

The signal generator 384 is electrically coupled to the electrodes 340, 342, 344, 346, 348, 350, 358, 362, 364, and 366, e.g., via conductors of the respective lead 318, 320, 322, or, in the case of the housing electrode 358, via an electrical conductor disposed within the housing 360 of the IMD 316. The signal generator 384 is configured to generate and deliver electrical stimulation therapy to the heart 312. For example, the signal generator 384 may deliver defibrillation shocks to the heart 312 via at least two electrodes 358, 362, 364, 366. The signal generator 384 may deliver pacing pulses via the ring electrodes 340, 344, 348 coupled to the leads 318, 320, and 322, respectively, and/or the helical electrodes 342, 346, and 350 of leads 318, 320, and 322, respectively. In some implementations, the signal generator 384 delivers pacing, cardioversion, or defibrillation stimulation in the form of electrical pulses. In other implementations, the signal generator 384 may deliver one or more of these types of stimulation in the form of other signals, such as sine waves, square waves, or other substantially continuous time signals.

The processor 380 controls the signal generator 384 to deliver stimulation therapy to the heart 312. The processor 380 may control the signal generator 384 to deliver stimulation according to a selected one or more therapy programs, which may be stored in memory 382. For example, the processor 380 may control the signal generator 384 to deliver electrical pulses with amplitudes, pulse widths, frequencies, or electrode polarities specified by the selected one or more therapy programs.

The processor 380 may select which of the electrodes 340, 342, 344, 346, 348, 350, 358, 362, 364 or 366 delivers electrical pulses. For example, the signal generator 384 may include a switch module that the processor 380 may use to select, e.g., via a data/address bus, which of the available electrodes are used to deliver pacing, cardioversion, or defibrillation pulses. The switch module may include a switch array, switch matrix, multiplexer, or any other type of switching device suitable to selectively couple electrical pulses to electrodes selected by the processor 380.

The electrical sensing module 386 monitors signals from at least one of the electrodes 340, 342, 344, 346, 348, 350, 358, 362, 364 or 366 in order to monitor electrical activity of the heart 312. The processor 380 may select which of the electrodes 340, 342, 344, 346, 348, 350, 358, 362, 364 or 366 function as sense electrodes. For example, the electrical sensing module 386 may include a switch module that the processor 380 may use to select, e.g., via a data/address bus, which of the electrodes are used to monitor electrical activity of the heart 312.

The electrical sensing module 386 may include multiple detection channels, each of which may comprise an amplifier. The multiple detection channels may also include signal conditioning capacitors implemented using the thin-film capacitor structure according to the present disclosure. In response to the signals from processor 380, the switch module within the electrical sensing module 386 may couple selected electrodes to each of the detection channels.

The signal generator 384 may include a high voltage charge circuit and a high voltage output circuit when the IMD 316 is configured to generate and deliver defibrillation pulses to the heart 312. In response to the detection of atrial or ventricular fibrillation or tachyarrhythmia requiring a cardioversion pulse, the processor 380 may activate a cardioversion/defibrillation control module. The cardioversion/defibrillation control module may be a hardware component of the processor 380 and/or a firmware or software module executed by one or more hardware components of the processor 380. The cardioversion/defibrillation control module may initiate charging of the high voltage capacitors of the high voltage charge circuit of the signal generator 384 under control of a high voltage charging control line. In some implementations, the high voltage capacitors of the high voltage charge circuit may include the thin-film capacitor structures according to the present disclosure. In a high voltage application, the thin-film capacitor structures may include electrode and dielectric layers capable of accommodating such a high voltage application. For example, the dielectric layer may include a high-k dielectric in a high voltage application.

The processor 380 may monitor the voltage on the high voltage capacitor, e.g., via a voltage charging and potential (VCAP) line. In response to the voltage on the high voltage capacitor reaching a predetermined value set by the processor 380, the processor 380 may generate a logic signal that terminates charging. Thereafter, timing of the delivery of the defibrillation or cardioversion pulse by the signal generator 384 is controlled by the cardioversion/defibrillation control module of processor 380. Following delivery of the fibrillation or tachycardia therapy, the processor 380 may return the signal generator 384 to a cardiac pacing function and await the next successive interrupt due to pacing or the occurrence of a sensed atrial or ventricular depolarization.

The telemetry module 388 includes any suitable hardware, firmware, software or any combination thereof for communicating with another device, such as the programmer 324. Under the control of the processor 380, the telemetry module 388 may receive downlink telemetry from and send uplink telemetry to the programmer 324 with the aid of an antenna (not shown), which may be internal and/or external.

The processor 380 may store cardiac EGMs for physiological episodes, such as tachyarrhythmias, within memory 382. For example, processor 380 may store cardiac EGMs for atrial and ventricular tachycardia and fibrillation episodes, in response to the detection of the tachycardia or fibrillation. The processor 380 may also store marker channel data for each EGM in memory 382.

The various components of the IMD 316 are coupled to a power source 398, which may include a rechargeable or non-rechargeable battery. A non-rechargeable battery may be capable of holding a charge for several years, while a rechargeable battery may be inductively charged from an external device, e.g., on a daily or weekly basis.

Although the substrate 108 including any of the four-arm pillars 110-2, 110-3, 110-4, 110-5, and 110-6 has been described as a substrate used for thin-film capacitors, the substrate 108 may be used to form other thin-film devices. For example, the substrate 108 including any of the four-arm pillars 110-2, 110-3, 110-4, 110-5, and 110-6 may be used in any application that benefits from an increased device is per unit area of substrate. In one implementation, the substrate 108 may be used to fabricate a battery, for example, by selecting appropriate top and bottom electrodes 104, 106 and by replacing the dielectric layer 102 with an electrolyte material.

Various examples have been described. These and other examples are within the scope of the following claims.

The invention claimed is:

1. A method comprising:
    masking a substrate with a masking pattern that includes a plurality of masked regions, each of the masked regions having a perimeter that includes N protrusions that define N recessed regions between the N protrusions, wherein each of the N recessed regions of each of the plurality of masked regions receives one protrusion from an adjacent one of the plurality of masked regions, wherein each of the N protrusions of each of the plurality of masked regions includes additional protrusions, wherein the N protrusions and the additional protrusions define a fractal-like pattern, and wherein N is an integer greater than two; and
    etching the substrate to define a plurality of pillars that project from a surface of the substrate, each of the plurality of pillars having the perimeter.

2. The method of claim 1, further comprising fabricating a thin-film capacitor over the plurality of pillars.

3. The method of claim 2, further comprising:
depositing a first electrode of the thin-film capacitor in a conformal layer over the plurality of pillars;
depositing a dielectric material of the thin-film capacitor in a conformal layer over the first electrode; and
depositing a second electrode of the thin-film capacitor over the dielectric material.

4. A thin-film device system comprising:
a substrate; and
a plurality of pillars that project from a surface of the substrate, each of the plurality of pillars having a perimeter that includes N protrusions that define N recessed regions between the N protrusions, wherein each of the N recessed regions of each of the plurality of pillars receives one protrusion from an adjacent one of the plurality of pillars,
wherein each of the N protrusions of each of the plurality of pillars includes additional protrusions,
wherein the N protrusions and the additional protrusions define a fractal-like pattern, and
wherein N is an integer greater than two.

5. The thin-film device system of claim 4, further comprising a thin-film capacitor fabricated over the plurality of pillars.

6. The thin-film device system of claim 5, wherein the thin-film capacitor comprises:
a first electrode deposited in a conformal layer over the plurality of pillars;
a dielectric deposited in a conformal layer over the first electrode; and
a second electrode deposited over the dielectric.

7. The thin-film device system of claim 4, wherein each of the N protrusions includes a middle-arm region, and wherein the middle-arm region includes at least one of the additional protrusions.

8. The thin-film device system of claim 7, wherein each of the N protrusions includes an end region, and wherein the end region includes at least one of the additional protrusions.

9. The thin-film device system of claim 4, wherein each of the N protrusions includes an end region, and wherein the end region includes at least one of the additional protrusions.

10. The thin-film device system of claim 4, wherein N equal four.

11. The thin-film device system of claim 4, wherein the N protrusions comprise at least one of a rectangular shape or a curvilinear shape.

12. The thin-film device system of claim 4, wherein the additional protrusions comprise at least one of a rectangular shape or a curvilinear shape.

13. The thin-film device system of claim 4, wherein the perimeter of each of the plurality of pillars defines a center region from which the N protrusions protrude.

14. The thin-film device system of claim 13, wherein the N protrusions are substantially equally spaced around the center region.

15. The thin-film device system of claim 4, wherein each of the plurality of pillars includes an axis of symmetry.

16. The thin-film device system of claim 4, wherein each of the plurality of pillars includes four axes of symmetry.

* * * * *